(12) United States Patent  
Li et al.

(10) Patent No.: US 9,007,841 B1
(45) Date of Patent: Apr. 14, 2015

(54) PROGRAMMING SCHEME FOR IMPROVED VOLTAGE DISTRIBUTION IN SOLID-STATE MEMORY

(71) Applicant: Western Digital Technologies, Inc., Irvine, CA (US)

(72) Inventors: Haibo Li, Sunnyvale, CA (US); Dengtao Zhao, Santa Clara, CA (US); Yongke Sun, Pleasanton, CA (US); Kroum S. Stoev, Pleasanton, CA (US); Guirong Liang, Santa Clara, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 14/102,356

(22) Filed: Dec. 10, 2013

Related U.S. Application Data

(60) Provisional application No. 61/895,248, filed on Oct. 24, 2013.

(51) Int. Cl.
*G11C 16/04* (2006.01)
*G11C 16/10* (2006.01)

(52) U.S. Cl.
CPC ..................................... *G11C 16/10* (2013.01)

(58) Field of Classification Search
USPC .............. 365/185.19, 185.22, 185.03, 185.12
See application file for complete search history.

(56) References Cited

U.S. PATENT DOCUMENTS

| | | | |
|---|---|---|---|
| 6,807,096 B2 | 10/2004 | Toda | |
| 6,856,556 B1 | 2/2005 | Hajeck | |
| 7,126,857 B2 | 10/2006 | Hajeck | |
| 7,430,136 B2 | 9/2008 | Merry, Jr. et al. | |
| 7,447,807 B1 | 11/2008 | Merry et al. | |
| 7,502,256 B2 | 3/2009 | Merry, Jr. et al. | |
| 7,509,441 B1 | 3/2009 | Merry et al. | |
| 7,596,643 B2 | 9/2009 | Merry, Jr. et al. | |
| 7,653,778 B2 | 1/2010 | Merry, Jr. et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1 | 6/2010 | Walston et al. | |
| 7,765,373 B1 | 7/2010 | Merry et al. | |
| 7,898,855 B2 | 3/2011 | Merry, Jr. et al. | |
| 7,912,991 B1 | 3/2011 | Merry et al. | |

(Continued)

FOREIGN PATENT DOCUMENTS

| | | |
|---|---|---|
| EP | 931289 B1 | 11/2003 |
| EP | 1866928 B1 | 7/2013 |

OTHER PUBLICATIONS

International Search Report and Written Opinion dated Jan. 20, 2015 from related PCT International Application No. PCT/US2014/062295, 13 pgs.

*Primary Examiner* — David Lam

(57) ABSTRACT

Systems and methods are disclosed for reducing programming interference in solid-state memory using a program suspend command. A data storage system includes a non-volatile memory array including a plurality of non-volatile memory devices and a controller configured to partially program a first cell coupled to a first word line. When a programming criterion associated with the first cell is met, the controller executes a program suspend command after which a second cell coupled to the first word line is at least partially programmed. Programming of the first cell is resumed following said at least partial programming of the second cell.

44 Claims, 10 Drawing Sheets

(56) References Cited

U.S. PATENT DOCUMENTS

| | | |
|---|---|---|
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,144,512 B2 * | 3/2012 | Huang et al. .............. 365/185.03 |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,203,885 B2 | 6/2012 | Abiko et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,300,458 B2 | 10/2012 | Cernea |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2009/0080251 A1 | 3/2009 | Kim |
| 2009/0158126 A1 | 6/2009 | Perlmutter et al. |
| 2010/0174849 A1 | 7/2010 | Walston et al. |
| 2010/0250793 A1 | 9/2010 | Syu |
| 2011/0099323 A1 | 4/2011 | Syu |
| 2011/0149651 A1 | 6/2011 | Gorobets et al. |
| 2011/0173380 A1 | 7/2011 | Yano et al. |
| 2011/0283049 A1 | 11/2011 | Kang et al. |
| 2012/0167100 A1 | 6/2012 | Li et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0132638 A1 | 5/2013 | Horn et al. |
| 2013/0145106 A1 | 6/2013 | Kan |
| 2013/0205085 A1 | 8/2013 | Hyun et al. |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

* cited by examiner

PROGRAMMING SCHEME FOR IMPROVED VOLTAGE DISTRIBUTION IN SOLID-STATE MEMORY

RELATED APPLICATION

This application claims the benefit of priority under 35 U.S.C. §119(e) of U.S. Provisional Application No. 61/895,248, filed on Oct. 24, 2013, and entitled "Programming Scheme for Improved Voltage Distribution in Solid-State Memory," the disclosure of which is hereby incorporated by reference in its entirety.

BACKGROUND

1. Field

This disclosure relates to data storage systems. More particularly, the disclosure relates to systems and methods for programming solid-state memory.

2. Description of Related Art

Certain solid-state memory devices, such as flash drives, store information in an array of memory cells constructed with floating gate transistors. Programming data to a solid-state memory cell can cause coupling interference between adjacent bit-lines or word-lines, thereby adversely affecting device performance.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1:
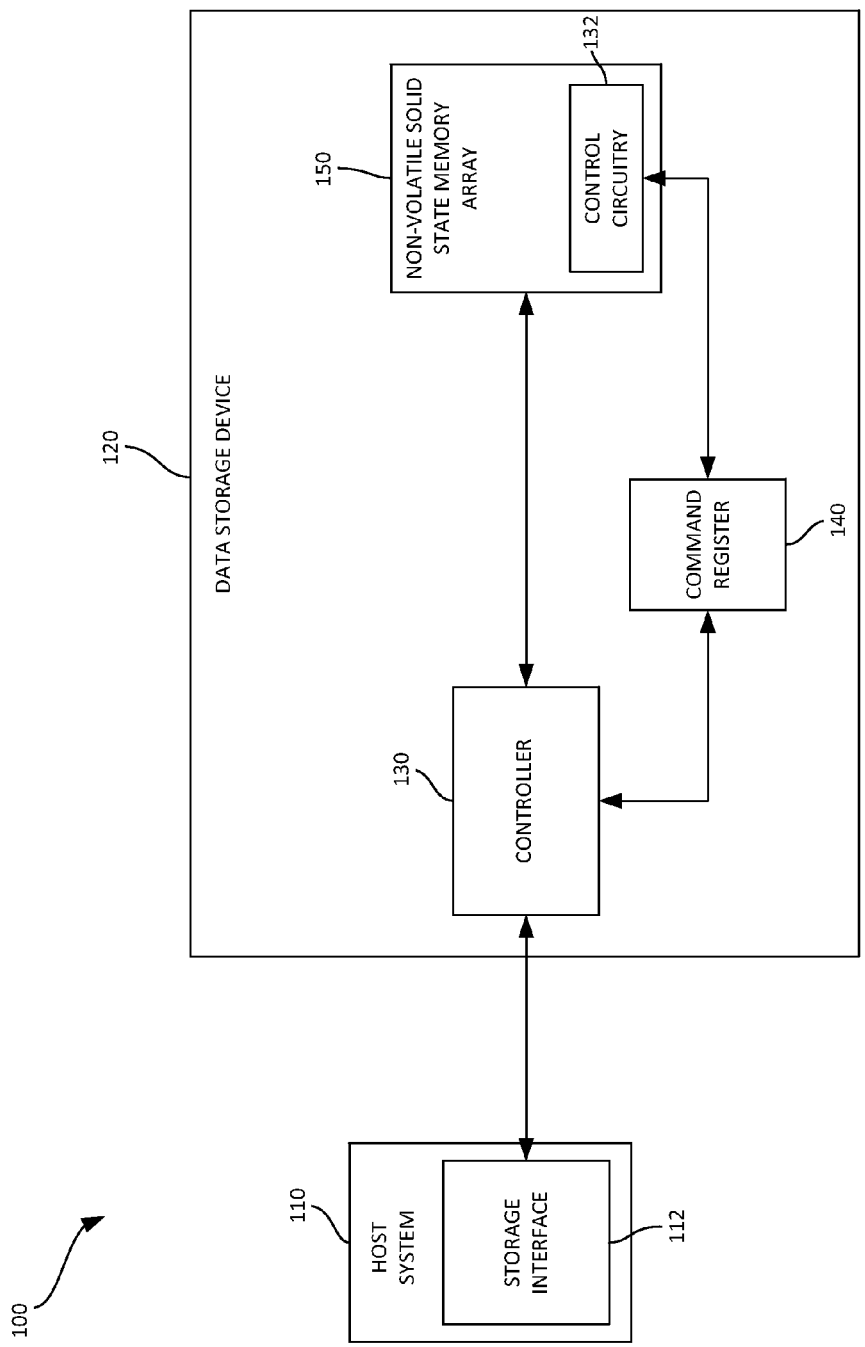
FIG. 1 is a block diagram of a data storage device according to an embodiment.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection. The headings provided herein are for convenience only and do not necessarily affect the scope or meaning of the claimed invention.

Overview

The present disclosure provides systems and methods for executing programming commands in solid-state memory. Solid-state memory cells may be programmed according to multi-level cell (MLC), single-level cell (SLC), lower page only (LPO), or other bit coding scheme. Furthermore, solid-state cells may be programmed using a half-bit line (HBL), all-bit line (ABL) or other programming architecture. Although certain embodiments are described herein in the context of various programing schemes, it should be understood that principles disclosed herein may be applicable to any suitable or practical programming scheme.

With respect to HBL architecture, a memory device may have the ability to simultaneously access approximately half of the output lines, or bit lines, of the memory, or portion thereof. Therefore, cells may be programmed with respect to interleaving even/odd pages, wherein "even" relates to one half and "odd" relates to the other. Cells may therefore include four logical pages, namely even lower, even upper, odd lower, and odd upper pages, which share the same word line. In certain embodiments, even pages are programmed prior to the programming of odd pages, or vice versa. However, this can lead to substantial bit-line-to-bit-line coupling interference to the cells on the even pages under certain conditions. Furthermore, threshold voltage distribution of the cells on even pages may become wider than those of corresponding odd pages if substantially similar program parameters are used. In order to overcome potential performance degradation in view of this potentially damaging interference, various methods may be implemented, such as, for example, reduced step size for even page programming, different program verify levels for even/odd pages, and the like. However, such solutions can result in relatively low performance in even page programming, and/or increased design complexity. Although the terms "even" and "odd" are used herein, such terms may be used interchangeably, wherein "even" can refer to "odd," and vice versa.

Certain embodiments allow for improvement of threshold voltage distributions by reducing bit-line-to-bit-line coupling interference in HBL memory. Reduction in coupling interference may be achieved at least in part through the use of a "program suspend" command. For example, in HBL MLC memory, the data storage system may be configured to generate program suspend commands when a certain criterion is met, thereby causing the program sequence on even upper page to be suspended. Execution of the program suspend command may be followed by the execution of the programming of the odd upper page on the same word-line, after which the programming may resume on the even upper page until complete. Such a programing scheme may help to reduce bit-line-to-bit-line coupling interference, as well as help achieve improved threshold voltage distribution for at least the cells on the even pages.

In solid-state memory, narrow word-line pitch and/or high voltage in selected word-lines may disturb other word-lines in the same block. With respect to ABL architecture, a memory device may have the ability to simultaneously access all the bit lines connected to page buffers of the memory, or portion thereof. Therefore, in certain embodiments, ABL can deliver up to twice the parallelism of HBL, and therefore improved relative performance. Embodiments disclosed herein may reduce word-line-to-word-line interference in ABL solid-state memory by combining "full sequence programming" and "program suspend" commands.

ABL MLC solid-state memory may include two logical pages (lower and upper) on a single word-line (WL). When compared to HBL, ABL may comprise larger page size and/or higher performance at the cost of larger area (e.g., approximately double) for sensing amplifiers. In certain embodiments, programming includes two phases: (1) programming cells to an "intermediate" state using a relatively large step size; and (2) programming cells to the "final" states using relatively small step size. The two phases can be alternatively performed on consecutive word-lines. However, such a process can be undesirably slow when the program voltage starts from low values in both phases. In order to decrease the programming time, a "full sequence" programming process may be implemented in which all higher states are programmed to their target positions at one sequence. For example, each word-line (both lower and upper pages) can be programmed at one time, which may result in relatively large word-line-to-word-line coupling interference to the previous word-line, causing wider voltage state distributions.

In certain ABL MLC memory embodiments, a "full sequence" type of program scheme is used in connection with a "program suspend" command that may be generated when certain criteria is met. The program suspend command may cause the program sequence to be suspended on the first word-line, after which a similar "program and suspend" operation is executed on a second word-line. The programming may then resume on the first word-line until it finishes. Further details of this method are described below. Such method may help to at least partially minimize word-line-to-word-line coupling interference, while maintaining relatively high write performance. Similar schemes may also be applied to SLC or LPO (lower page only) programming.

TERMINOLOGY

As used in this application, "non-volatile solid-state memory," "non-volatile memory," "NVM," or variations thereof may refer to solid-state memory such as NAND flash. However, the systems and methods of this disclosure may also be useful in more conventional hard drives and hybrid drives including both solid-state and hard drive components. In some embodiments, the solid-state memory may be used in a computing device to extend storage capacity of volatile memory such as DRAM. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

The terms "page," "target page," or variations thereof are used herein according to their broad and ordinary meaning. For example, "page" may refer to a block of a physical memory cells, or to the physical memory cells themselves. Furthermore, within a multi-level cell (MLC), "page" may refer to either of upper or lower pages.

Data Storage Device

FIG. 1 is a block diagram illustrating an embodiment of a combination of a host system 110 with a data storage device 120 incorporating programming functionality in accordance with embodiments disclosed herein. As shown, the data storage device 120 (e.g., hybrid hard drive, solid-state drive, any storage device utilizing solid-state memory, etc.) includes a controller 130 configured to at least partially control operation of the data storage device 120. The controller 130 includes a command register 140 configured to receive data commands and cause the controller 130 to execute such commands in the non-volatile solid-state memory array(s) 150. Such commands may include data programming commands as well as program suspend commands, as described herein. The controller 130 may be configured to receive data commands from a storage interface (e.g., a device driver) 112 residing on a host system 110. Data commands may specify a block address in the data storage device 120; data may be accessed/transferred based on such commands.

The data storage device 120 can store data received from the host system 110 such that the data storage device 120 acts as data storage for the host system 110. To facilitate this function, the controller 130 can implement a logical interface. The logical interface can present to the host system memory as a set of logical addresses (e.g., sequential/contiguous addresses) where data can be stored. Internally, the controller 130 can map logical addresses to various physical memory addresses in the non-volatile solid-state memory array 150 and/or other memory module(s). Mapping data indicating the mapping of logical addresses to physical memory addresses may be maintained in the data storage device. For example, mapping table data may be stored in non-volatile memory array(s) 150 in order to allow for recreation of mapping tables following a power cycle.

In an embodiment, the data storage device 120 may be a hybrid disk drive that additionally includes magnetic memory storage (not shown). In such case, one or more controllers 130 may control the magnetic memory storage and the non-volatile solid-state memory array(s) 150.

In certain embodiments, the controller 130 may be configured to implement a programming scheme to improve the threshold voltage distributions in the non-volatile solid-state memory array(s) by reducing cell-to-cell interference. For example, the controller 130 may reduce bit-line-to-bit-line coupling interference in HBL memory by implementing program suspend commands, and/or may reduce word-line-to-word-line interference in ABL memory by combining full sequence programming and program suspend commands.

Program suspend commands may be implemented in certain solid-state programming schemes. For example, a data storage device may include a solid-state memory array, a command register, and memory array control circuitry, as illustrated in FIG. 1 and described above. The command register 140 may be configured to decode a program suspend command and provide a suspend signal as an output. In one embodiment, the memory array 150 may include control circuitry 132 that may be coupled to receive the suspend signal from the command register 140 and suspend the program operation upon receiving the suspend signal. In other embodiments, the suspension of program operation may be accomplished through other signals and mechanisms, e.g., via a direct signal from the controller 130 to the memory array 150.

Figure 2:
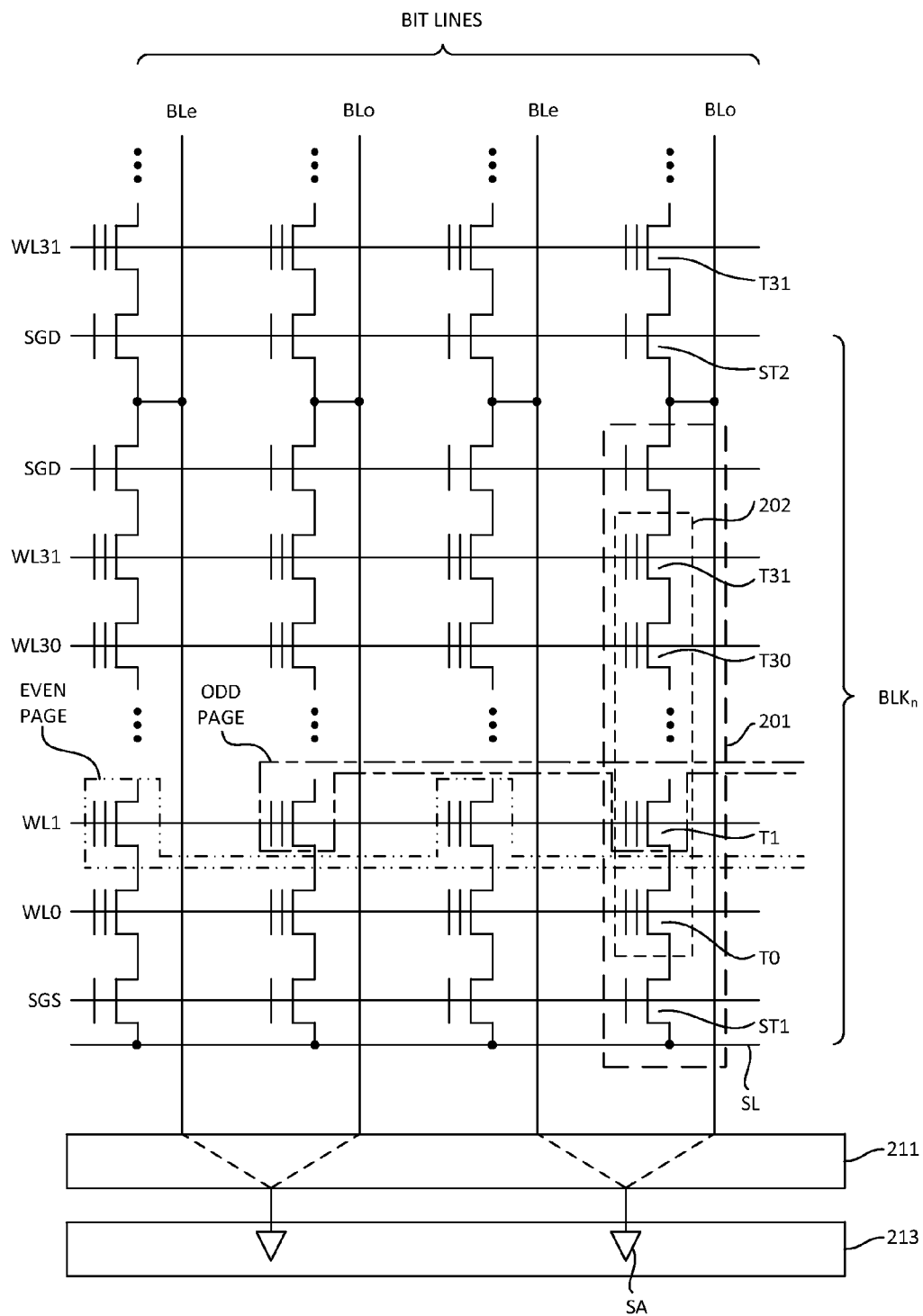
FIG. 2 is a schematic diagram of solid-state memory cells in a non-volatile memory device according to an embodiment.

FIG. 2 is a schematic diagram of solid-state memory cells in a non-volatile memory device according to an embodiment. A solid-state memory array, such as a NAND flash array, may include memory cell units 201, each unit comprising a memory cell group 202 that includes a plurality of serially-connected memory cell transistors T which may be configured to store an electrical charge representative of data, as described herein. The block unit 201 may further include a first select transistor ST1 that is connected between one end of the memory cell group 202 and a source line SL, as well as a second select transistor ST2 that is connected between the other end of the memory cell group 202 and a bit line BL (shown as BLo in FIG. 2). Groups of memory cell units associated with separate bit lines may be organized into blocks of memory, such as block $BLK_n$. The memory cell array may further include additional blocks like the block $BLK_n$. Additional blocks may have the same structure as block $BLK_n$. In certain embodiments, data erase operations are performed in units of a block BLK, and data program and read operations are performed in units of a page.

Within the block $BLK_n$, each memory cell group 202 that constitutes the memory cell unit 201 may include, for example, 32 memory cells T0-T31. Between adjacent memory cell units, a plurality of word lines WL (e.g., 32) may connect gate electrodes of the memory cells on the same row. The array may further include a first select gate line SGS configured to connect gate electrodes of the first select transistor ST1 and a second select gate line SGD configured to connect gate electrodes of the second select transistor ST2.

In certain embodiments, alternating cells on a word line may correspond to even and odd pages, respectively. The even and odd pages may be programmable independently from one another. A sense amplifier circuit 213 may be configured to be selectively connected via a selector circuit 211 to an even bit line BLe (e.g., a set of even-numbered bit lines BL), or to an odd bit line BLo (e.g., a set of odd-numbered bit lines BL), and to detect the potential of the even bit line BLe or the odd bit line BLo to store the detected potential in a data cache. The selector circuit 211 may select between the even and odd bit line BL groups and connect the selected group to the sense amplifiers SA. During data read operations, the non-selected bit lines BL may be grounded to decrease the coupling noise between bit lines.

Figure 3:
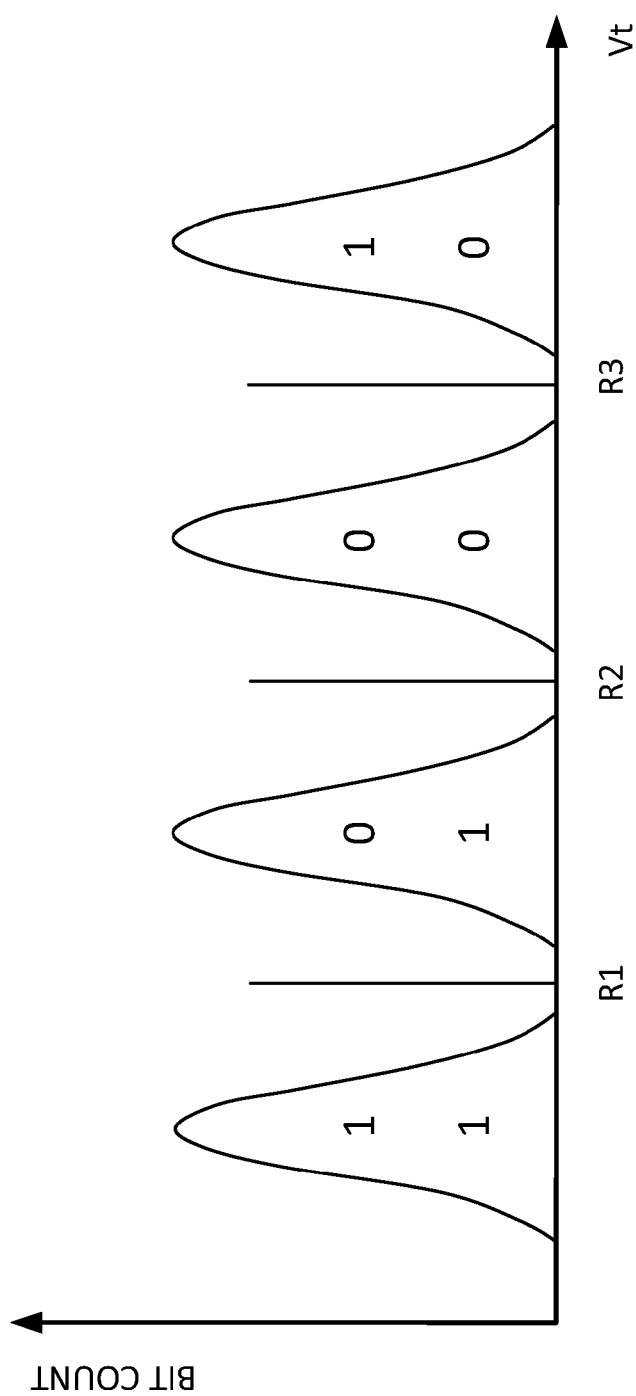
FIG. 3 is a graph showing a probability distribution of cells in a solid-state memory device according to an embodiment.

FIG. 3 is a graph showing a probability distribution of cells in a non-volatile memory array according to an embodiment. The distribution of FIG. 3 may correspond to a word line in a solid-state memory array, or to an even or odd page thereof. As discussed above, due to bit-line and/or word-line coupling interference, the states of a threshold voltage distribution can widen undesirably. The distribution shown in FIG. 3 illustrates charge states in an MLC programming scheme including four distinct programming states, each comprising two bits of data. For example, a first state (e.g., an erase state) may correspond to a two-bit value of "11." Higher voltage states may comprise to values of "01," "00," and "10," respectively, for example. As described herein, a first bit of a two-bit programming state may represent a most significant bit (MSB), or "upper page" of data, while a second bit may represent a least significant bit (LSB), or "lower page."

HBL Upper Page Programming

Figure 4:
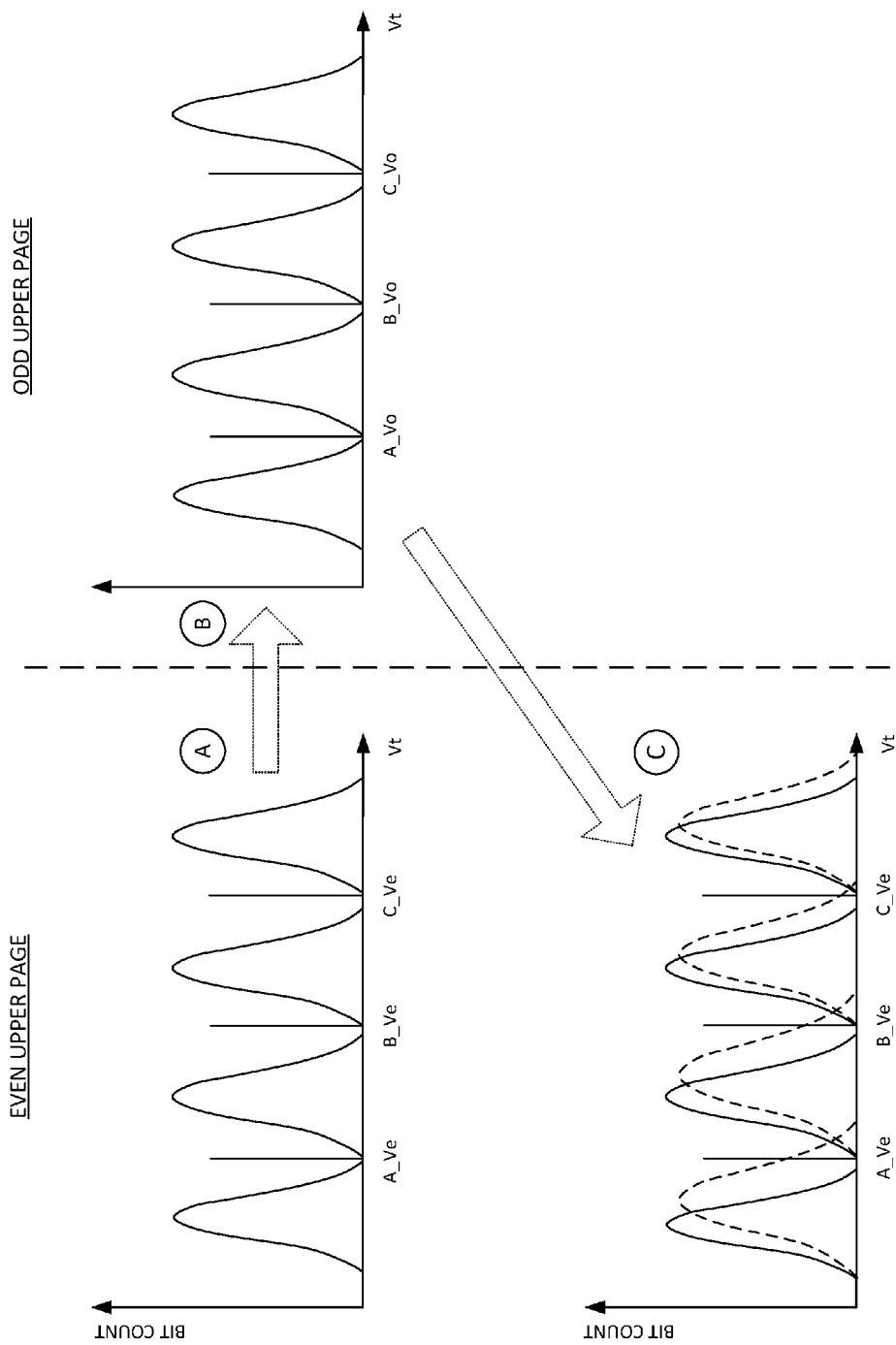
FIG. 4 provides probability distributions for memory cells in a solid-state memory device according to an embodiment.

FIG. 4 illustrates voltage distributions for even and odd upper pages in an HBL MLC programming scheme. The distributions of FIG. 4 illustrate the possible effect of bit-line-to-bit-line interference on even page cells from odd page cells. As shown, in certain embodiments, an even upper page is programmed to completion (A), after which the corresponding odd upper page is programmed (B) to completion. The programming of the odd upper page may cause the even page distribution to widen due to interference, as represented by the dashed lines in the distribution (C). In certain embodiments, the even page distribution widening due to the coupling interference from the odd page programming is not mitigable because it occurs after the even upper page program is finished.

Solid-state memory control systems may incorporate program finish criterion, wherein after one or more program pulses, a program verify operation is implemented to determine whether the memory cell(s) have been successfully written or not. For example, the program verify operation may include a read operation to verify that the cell charge level is beyond a threshold level. If all the cells intended to be programmed have a charge level higher than the threshold, then the program operation may be deemed complete. Otherwise, one or more cells may receive a further program pulse. In certain embodiments, when the number of program pulses exceeds a predetermined maximum number of possible pulses without successful programming, the program operation fails.

Figure 5:
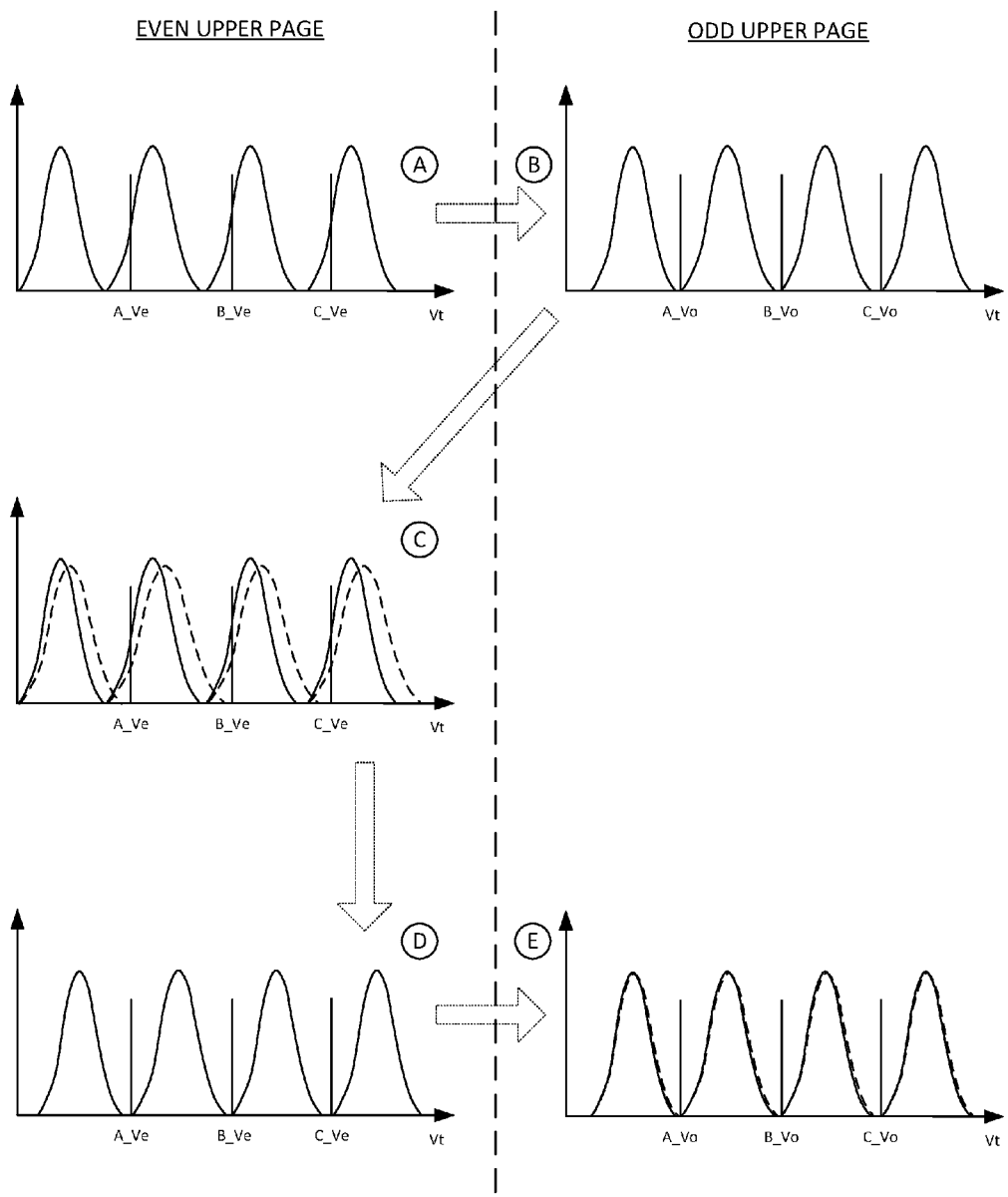
FIG. 5 provides probability distributions for memory cells in a solid-state memory device according to an embodiment.

FIG. 5 shows even and odd page threshold voltage distributions illustrating a programming scheme for at least partially obviating the effects of bit-line-to-bit-line interference in HBL architecture. In certain embodiments, a controller may improve performance (e.g., reduce cell-to-cell interference) by utilizing pre-determined criterion values larger than the program finish criterion values. Alternatively, or additionally, a pre-determined program pulse number; a pre-determined program voltage, and/or the special command of "program suspend" may be implemented to improve performance.

The scheme of FIG. 5 involves suspending the even upper page programming before it finishes, and resuming the programming after odd upper page programming is complete. The distribution (A) illustrates an even upper page voltage distribution after program suspend has been executed. As shown, the even upper page may be programmed to an "intermediate" state, rather than fully programming the page. Portions of certain of the programming state distributions may overlap the respective verify threshold levels due to the suspension of programming prior to completion. The distribution (B) illustrates an odd upper page programmed subsequently to the execution of the program suspend command. The odd upper page may be programmed to completion, or only partially. The distribution (C) shows the effect interference from the odd upper page programming may have on the partially-programmed even upper page. Specifically, the state distributions of the even upper page may widen as a result of bit-line-to-bit-line interference.

The distribution (D) illustrates the even upper page threshold voltage distribution after completion of programming following odd upper page programming. The completion of even upper page programming may interfere with the previously-programmed odd upper page to some degree (see (E)). However, because the completion of the even upper page programming only involves a partial program, the effect of the interference on the odd page may be relatively minimal. If the same step size is used for both even and odd upper page programming, substantially identical program performance and Vt distribution may be obtainable for both even and odd pages. In certain embodiments, pre-determined program suspend criterion and implementation may be characterized and/or optimized in firmware.

Figure 6:
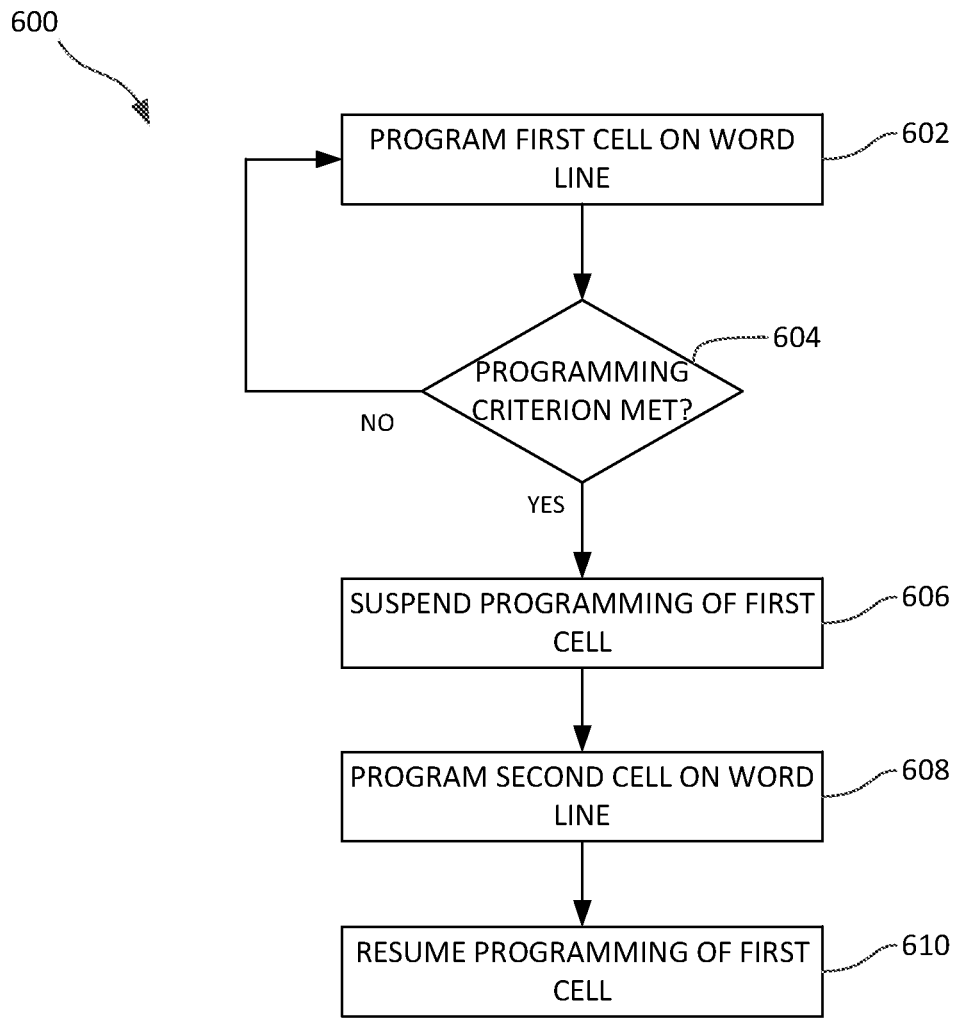
FIG. 6 provides a flow diagram for a process for programming memory cells in a solid-state memory device.

FIG. 6 provides a flow diagram for a process 600 for programming memory cells in a solid-state memory device according to an embodiment. In one embodiment, the process 600 is performed at least partially by the controller 130 and/or the memory array's control circuitry 132 described above in connection with FIG. 1. The process 600 may be performed in connection with HBL programing of at least a portion of a solid-state memory array. The process 600 may include partially programming a first cell, or page, on a word line at block 602. While description of certain programming methods herein may be in the context of a single cell of a plurality of cells (e.g., page), cell programming may be performed collectively on the plurality of cells in a single programming operation. The first cell/page may be an even or odd cell/page on a first word line. When a programming criterion has been met, the process 600 may involve executing a program suspend command, wherein programming of the first cell/page is suspended for a period of time. The programming criterion may be associated with, for example, a cell charge level, number of programming pulses applied to the first/page cell, or other programming metric.

In certain embodiments, when programming of the first cell/page has been suspended, the process 600 involves programming a second cell/page of the first word line at block 608. For example, the second cell/page may be an adjacent cell to the first cell/page, where the first cell/page is an even cell/page and the second cell/page is an odd cell/page, or vice versa. Following programming of the second cell/page, the process 600 may include resuming programming of the first cell/page at block 610. The process 600 may provide for reduced bit-line-to-bit-line interference between the first cell/page and the second cell/page.

ABL Full Sequence Programming

Figure 7:
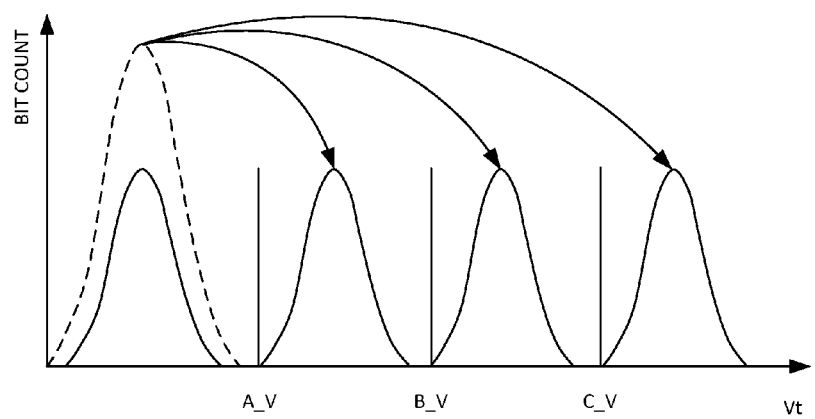
FIG. 7 provides a probability distribution for memory cells in a solid-state memory device according to an embodiment.
Figure 8:
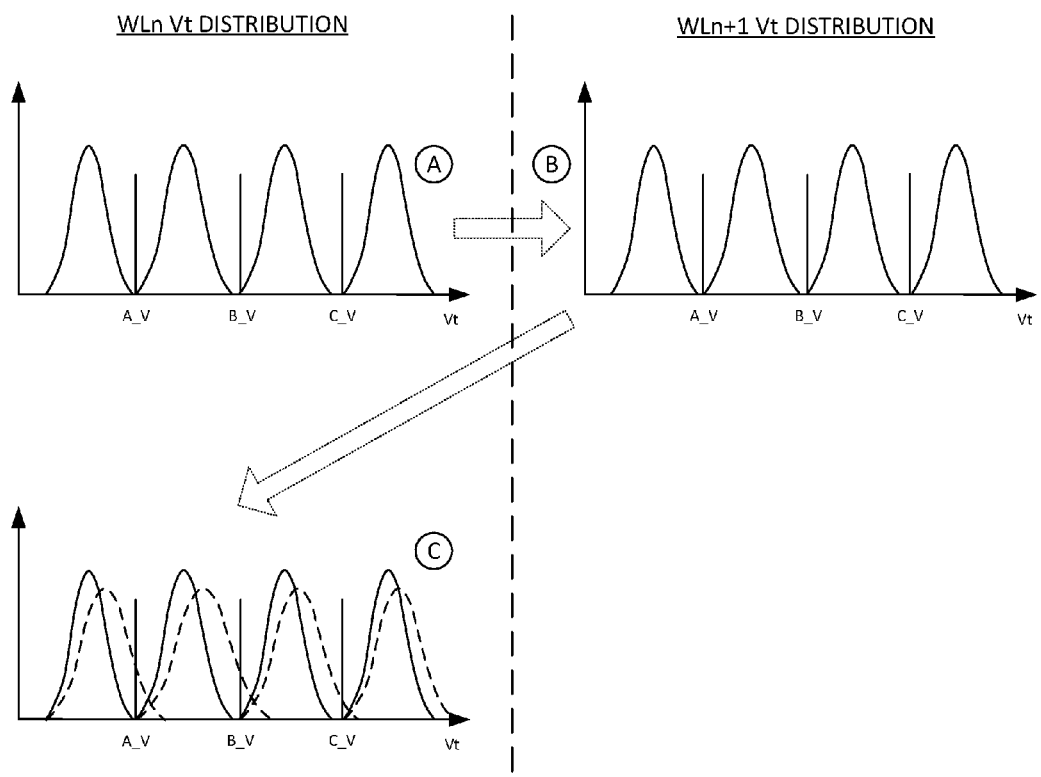
FIG. 8 provides probability distributions for memory cells in a solid-state memory device according to an embodiment.

FIG. 7 shows threshold voltage distributions for a full sequence programming process in an ABL architecture. During normal full sequence programming, word-line-to-word-line coupling interference may result, affecting contiguous word-lines. An example distribution (A) of voltage states following programming for a certain word-line ($WL_n$) is shown in FIG. 8. After programming of $WL_n$, a contiguous word-line ($WL_{n+1}$) is programmed, wherein the resulting distribution (B) is shown. Programming of the $WL_{n+1}$ distribution can result in interference affecting the word line $WL_n$. The distorted distribution (C) is shown, wherein each of the programming states becomes wider. Because such interference occurs after $WL_n$ programming is complete, mitigation of the interference may not be possible or practical.

In certain embodiments, a pre-determined program suspend criterion (for example, at a pre-determined program pulse number, or a pre-determined program voltage) may be utilized to reduce the effects of interference. For example, a status machine in the memory control circuitry may be configured to determine that the criterion has been met during program verify, wherein the program is suspended based at least in part on such determination. In certain embodiments, $WL_n$ programming is suspended before completion, and resumes after programming of $WL_{n+1}$ is suspended or completed.

Figure 9:
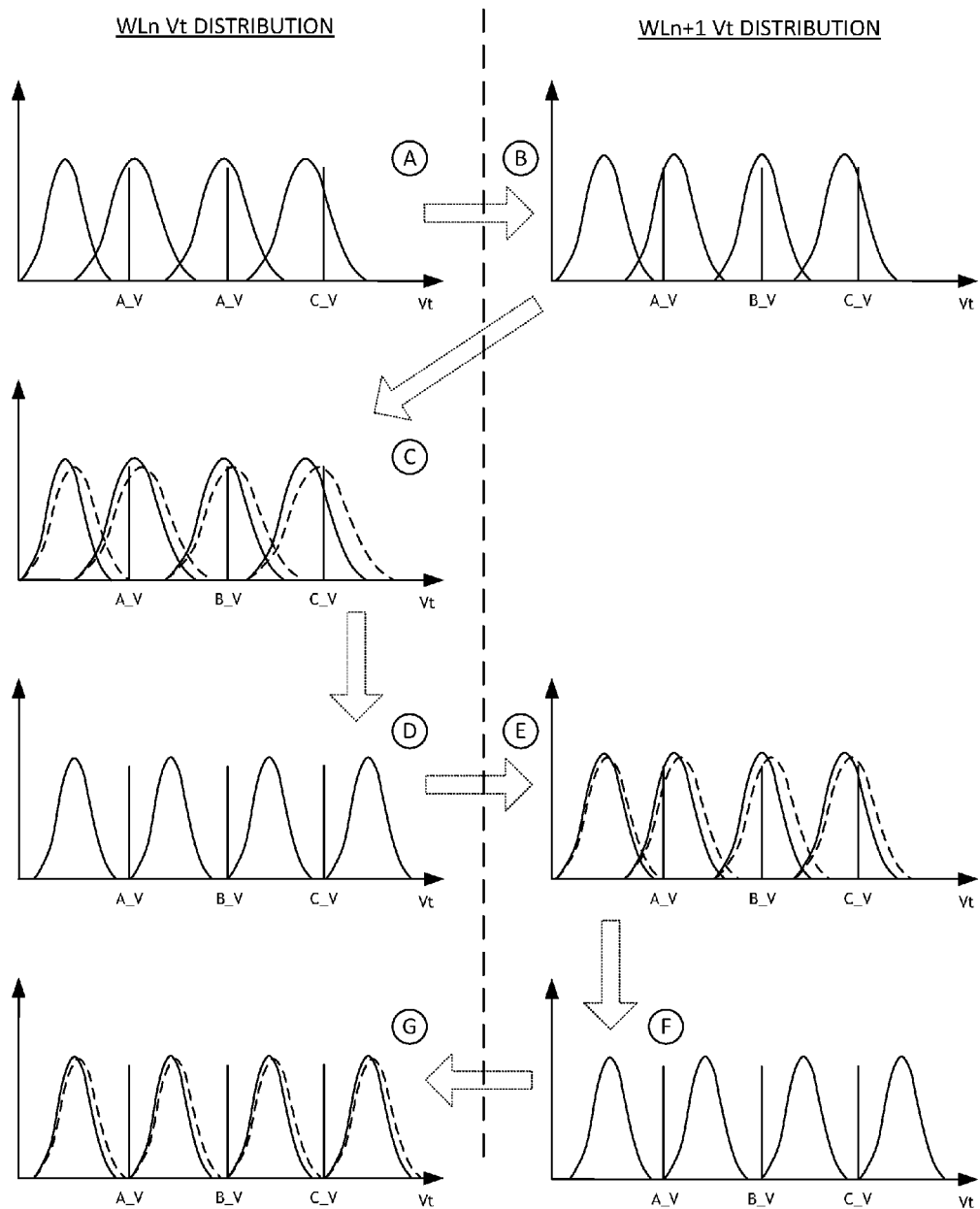
FIG. 9 provides probability distributions for memory cells in a solid-state memory device according to an embodiment.

FIG. 9 illustrates a programming scheme for improved threshold voltage distribution in an ABL full sequence program process. The distribution (A) shows voltage states following partial programming of a first word-line ($WL_n$), wherein programming of WLn is suspended. After suspension of $WL_n$ programming, a next word-line ($WL_{n+1}$) is partially programmed, wherein programming of $WL_{n+1}$ is also suspended prior to completion. In certain embodiments, programming of the word line $WL_{n+1}$ is completed prior to resuming programming of $WL_n$. Interference affecting $WL_n$ caused by the partial programming of $WL_{n+1}$ is represented in the distribution (C). After suspension of $WL_{n+1}$ programming, $WL_n$ programming is completed, as represented by the distribution (D). The completion of $WL_n$ programming may interfere with $WL_{n+1}$, causing distortion of the $WL_{n+1}$ distribution (E).

After completion of $WL_n$ programming, $WL_{n+1}$ programming may be completed, as shown in the distribution (F). The word-line-to-word-line coupling interference to the $WL_n$ cells by the $WL_{n+1}$ program from resuming to program completion may be relatively small, thereby resulting in a relatively tighter final voltage distribution (G) for $WL_n$ in comparison with normal full sequence programming. Furthermore, in certain embodiments, the write performance may be substantially similar (e.g., only data loading time is added when resuming programming) to normal full sequence programming.

Figure 10:
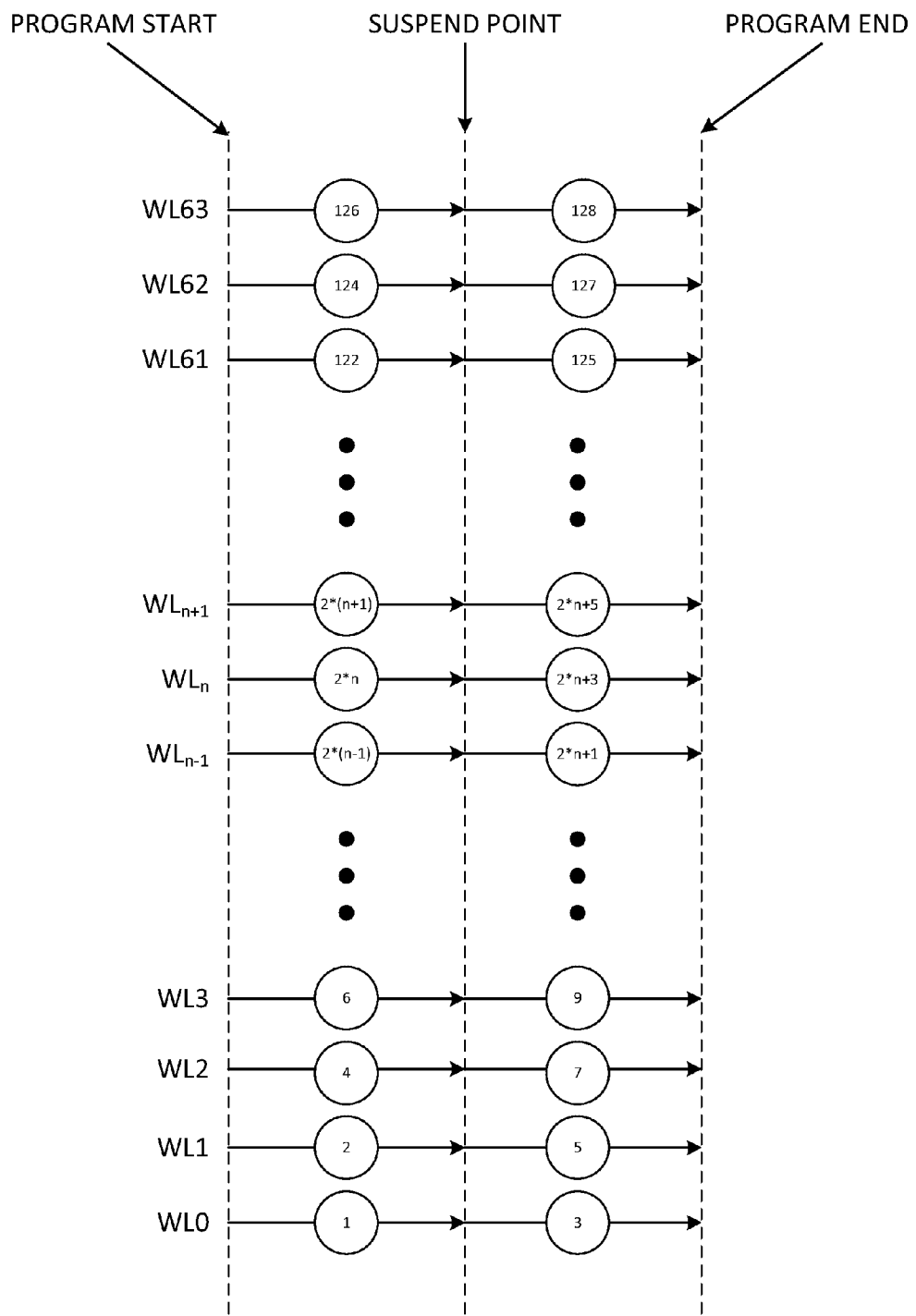
FIG. 10 shows a process for programming memory cells in a solid-state memory device according to an embodiment.

In certain embodiments, a relatively tight distribution may likewise be achieved for $WL_{n+1}$ by following the program sequence as demonstrated in FIG. 10, which may be similar to traditional 2-phase program methodology. The program sequence of FIG. 10 may improve voltage distribution in ABL full sequence programming processes. The reference numbers associated with the arrows in FIG. 10 may represent temporal order for program steps. Specifically, for example, a first word line (WL0) may be partially programmed, followed by partial programming of a contiguous word line (WL1). After partial programming of WL1, programming of WL0 may be completed. However, rather than next completing programming of WL1, the process may involve partially programming a third word line (WL2), after which the programming of WL1 may be completed. The relative order of operations described above may be continued for additional word lines. For example, FIG. 10 shows similar operation for word lines WL61-WL63. The process of FIG. 10 may be implemented for any desirable range of word lines. In certain embodiments, the pre-determined suspend point may vary for different WLs. In certain embodiments, pre-determined program suspend criterion and implementation may be characterized and optimized in firmware.

Figure 11:
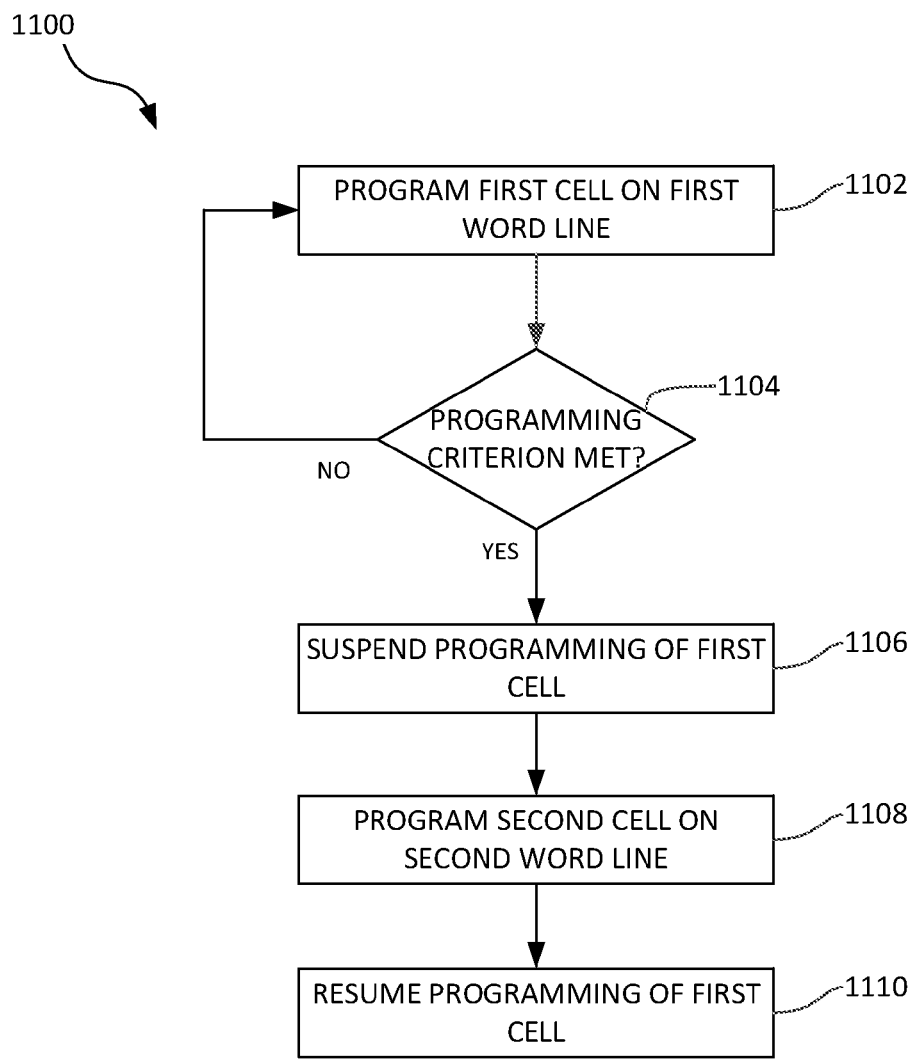
FIG. 11 provides a flow diagram for a process for programming memory cells in a solid-state memory device.

FIG. 11 provides a flow diagram for a process 1100 for programming memory cells in a solid-state memory device. In one embodiment, the process 1100 is performed at least partially by the controller 130 and/or the memory array's control circuitry 132 described above in connection with FIG. 1. The process 1100 may include partially programming one or more cells on a first word line at block 1102. For example, the first word line may be programmed using a full-sequence programming scheme. When a programming criterion has been met, the process 1100 may involve executing a program suspend command, wherein programming of the first word line is suspended for a period of time. The programming criterion may be associated with, for example, a cell charge level associated with cells of the first word line, number of programming pulses applied to the cells of the first word line, or other programming metric.

In certain embodiments, when programming of the first word line has been suspended, the process 1100 involves programming a second word line at block 608. For example, the second word line may be an adjacent word line to the first word line. Following programming, or partial programming, of the second word line, the process 1100 may include resuming programming of the first word line at block 1110. The process 1100 may provide for reduced word-line-to-word-line interference between the first word line and the second word line.

OTHER EMBODIMENTS

Certain embodiments disclosed herein provide a programming scheme for HBL MLC NAND flash memory to improve the voltage distribution of cells on the even pages by making use of the special "program suspend" command, with little sacrifice in program performance. For ABL MLC NAND flash memory, by combining "full sequence" program and "program suspend", tighter distributions may be achieved, while maintaining high performance. Similar schemes can also be applied to SLC or LPO (lower page only) programming.

In HBL MLC NAND flash memory, the even upper page program may have the same step size as the odd upper page, such that the program performance is improved. In ABL MLC NAND flash memory using full sequence program process, certain systems and methods described herein may result in reduced word-line-to-word-line coupling interference from the second word-line programming to the first word-line, such that the voltage distribution is improved, while maintaining relatively high write performance. Similar schemes may also be applied to SLC or LPO (lower page only) programming.

Those skilled in the art will appreciate that in some embodiments, other types of data storage systems and/or programming schemes can be implemented. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage device comprising:
a non-volatile memory array including a plurality of non-volatile memory devices; and
a controller configured to:
partially program a first cell coupled to a first word line;
determine that a programming criterion associated with the first cell is met;
execute a program suspend command;
at least partially program a second cell coupled to the first word line following execution of the program suspend command;
resume programming of the first cell following said at least partial programming of the second cell.

2. The data storage device of claim 1, wherein the second and first cells are disposed adjacent to one another on the word line.

3. The data storage device of claim 1, wherein the controller is further configured to at least partially reduce bit-line-to-bit-line interference between the first and second cells at least in part by executing the program suspend command.

4. The data storage device of claim 1, wherein the controller is further configured to program the first and second cells in accordance with a half bit line (HBL) programming scheme.

5. The data storage device of claim 1, wherein the programming criterion is met when a program verify command passes.

6. The data storage device of claim 1, wherein the programming criterion is met when the controller has applied a predetermined number of program pulses to the first cell.

7. The data storage device of claim 1, wherein the programming criterion is met when the controller has applied a predetermined program voltage level to the first cell.

8. The data storage device of claim 1, wherein the controller is further configured to resume the programming of the first cell after programming of the second cell is completed.

9. The data storage device of claim 1, wherein the controller is further configured to complete programming of the first cell when it resumes programming of the first cell.

10. The data storage device of claim 1, wherein the first cell is associated with an even page and the second cell is associated with an odd page.

11. The data storage device of claim 1, wherein the first cell is associated with an odd page and the second cell is associated with an even page.

12. The data storage device of claim 1, wherein the first word line is coupled to a first plurality of cells and a second plurality of cells interleaved with the first plurality of cells, wherein the controller is configured to program the first cell by programming the first plurality of cells and to program the second cell by programming the second plurality of cells.

13. A data storage device comprising:
a non-volatile memory array including a plurality of non-volatile memory devices; and
a controller configured to:
partially program a first cell coupled to a first word line;
determine that a programming criterion associated with the first cell is met;
execute a program suspend command;
partially program a second cell coupled to a second word line; and
resume programming of the first cell after said partial programming of the second cell.

14. The data storage device of claim 13, wherein the controller is further configured to complete programming of the first cell after said partial programming of the second cell and to complete programming of the second cell after completion of the programming of the first cell.

15. The data storage device of claim 14, wherein the controller is further configured to partially program a third cell coupled to a third word line after completion of the programming of the first cell and before completion of the programming of the second cell.

16. The data storage device of claim 13, wherein the controller is further configured to program the first and second cells in accordance with an all bit line (ABL) programming scheme.

17. The data storage device of claim 13, wherein the controller is configured to program the first and second cells using full-sequence programming.

18. The data storage device of claim 13, wherein the programming criterion is met when a program verify command passes.

19. The data storage device of claim 13, wherein the programming criterion is met when the controller has applied a predetermined number of program pulses to the first cell.

20. The data storage device of claim 13, wherein the programming criterion is met when the controller has applied a predetermined program voltage level to the first cell.

21. The data storage device of claim 13, wherein the first word line is adjacent to the second word line in the non-volatile memory array.

22. The data storage device of claim 13, wherein the controller is configured to at least partially reduce word-line-to-word-line interference between the first and second word lines at least in part by executing the program suspend command.

23. A method of programming data in a data storage system comprising a non-volatile memory array, the method comprising:
   partially programming a first cell coupled to a first word line;
   determining that a programming criterion associated with the first cell has been met;
   executing a program suspend command;
   at least partially programming a second cell coupled to the first word line following execution of the program suspend command; and
   resuming programming of the first cell following said at least partial programming of the second cell;
   wherein the method is performed under the control of a controller of the data storage system.

24. The method of claim 23, wherein the second and first cells are disposed adjacent to one another on the word line.

25. The method of claim 23, further comprising at least partially reducing bit-line-to-bit-line interference between the first and second cells at least in part by said executing the program suspend command.

26. The method of claim 23, further comprising programming the first and second cells in accordance with a half bit line (HBL) programming scheme.

27. The method of claim 23, wherein the programming criterion is met when a program verify command passes.

28. The method of claim 23, wherein the programming criterion is met when a predetermined number of program pulses have been applied to the first cell.

29. The method of claim 23, wherein the programming criterion is met when a predetermined program voltage level has been applied to the first cell.

30. The method of claim 23, further comprising resuming the programming of the first cell after programming of the second cell is completed.

31. The method of claim 23, further comprising completing programming of the first cell when resuming programming of the first cell.

32. The method of claim 23, wherein the first cell is associated with an even page and the second cell is associated with an odd page.

33. The method of claim 23, wherein the first cell is associated with an odd page and the second cell is associated with an even page.

34. The method of claim 23, wherein the first word line is coupled to a first plurality of cells and a second plurality of cells interleaved with the first plurality of cells, wherein programming the first cell comprises programming the first plurality of cells and programming the second cell comprises programming the second plurality of cells.

35. A method of programming data in a data storage system comprising a non-volatile memory array, the method comprising:
   partially programming a first cell coupled to a first word line;
   determining that a programming criterion associated with the first cell has been met;
   executing a program suspend command;
   partially programming a second cell coupled to a second word line; and
   resuming programming of the first cell after said partial programming of the second cell;
   wherein the method is performed under the control of a controller of the data storage system.

36. The method of claim 35, further comprising completing programming of the first cell after said partial programming of the second cell and to completing programming of the second cell after completion of the programming of the first cell.

37. The method of claim 36, further comprising partially programing a third cell coupled to a third word line after completing the programming of the first cell and before completing the programming of the second cell.

38. The method of claim 35, wherein said partially programing the first and second cells is performed in accordance with an all bit line (ABL) programming scheme.

39. The method of claim 35, wherein said partially programming the first and second cells is performed using full-sequence programming.

40. The method of claim 35, wherein determining that the programming criterion associated with the first cell has been met comprises determining that a program verify command has passed.

41. The method of claim 35, wherein the programming criterion is met when a predetermined number of program pulses has been applied to the first cell.

42. The method of claim 35, wherein the programming criterion is met when the controller has applied a predetermined program voltage level to the first cell.

43. The method of claim 35, wherein the first word line is adjacent to the second word line in the non-volatile memory array.

44. The method of claim 35, further comprising reducing word-line-to-word-line interference between the first and second word lines at least in part by said executing the program suspend command.

* * * * *